United States Patent
Raftari et al.

(10) Patent No.: US 6,720,792 B2
(45) Date of Patent: Apr. 13, 2004

(54) DETECTION OF DEMAGNETIZATION IN A MOTOR IN AN ELECTRIC OR PARTIALLY ELECTRIC MOTOR VEHICLE

(75) Inventors: Abbas Raftari, Northville, MI (US); Patrick J. Curran, Northville, MI (US); Vijay K Garg, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 121 days.

(21) Appl. No.: 09/682,531

(22) Filed: Sep. 17, 2001

(65) Prior Publication Data

US 2003/0055584 A1 Mar. 20, 2003

(51) Int. Cl.$^7$ .............................................. G01R 31/34
(52) U.S. Cl. ..................................................... 324/772
(58) Field of Search ............................ 324/772, 158.1; 318/490, 565, 798, 799; 322/99

(56) References Cited

U.S. PATENT DOCUMENTS

| | | | |
|---|---|---|---|
| 3,947,764 A | * 3/1976 | Abbott et al. ................ | 324/772 |
| 4,039,853 A | 8/1977 | Koizumi et al. ............. | 307/101 |
| 4,811,609 A | 3/1989 | Nishibe et al. ........... | 73/862.36 |
| 4,916,368 A | 4/1990 | Onoda et al. ................ | 318/723 |
| 4,967,123 A | * 10/1990 | Lebsock ...................... | 318/490 |
| 5,343,970 A | * 9/1994 | Severinsky ................. | 180/65.2 |
| 5,650,706 A | 7/1997 | Yamada et al. ............. | 318/701 |
| 5,689,166 A | 11/1997 | Nagayama et al. ......... | 318/721 |
| 5,751,132 A | * 5/1998 | Horvath et al. ............. | 318/798 |

* cited by examiner

*Primary Examiner*—Kamand Cuneo
*Assistant Examiner*—Russell M. Kobert
(74) *Attorney, Agent, or Firm*—Tung & Associates; Carlos L. Henze

(57) ABSTRACT

In an electric or hybrid electric vehicle, a voltage monitor (102) is directly coupled to a traction motor (38) and/or generator motor (30) to detect a permanent magnet induced voltage within the motor at a predetermined speed and no load condition. A controller (100) compares the detected permanent magnet induced voltage with an expected reference voltage that represents an expected permanent magnet induced voltage at full magnetization and the predetermined speed. The comparison includes identifying points of synchronization and using those points to determine a difference in the detected permanent magnet induced voltage that is caused by a faulty component.

22 Claims, 4 Drawing Sheets

DETECTION OF DEMAGNETIZATION IN A MOTOR IN AN ELECTRIC OR PARTIALLY ELECTRIC MOTOR VEHICLE

CROSS REFERENCE TO RELATED APPLICATIONS

This application is related to and shares disclosure with commonly assigned copending U.S. patent application Ser. number 09/849,576 now U.S. Pat. No. 6,573,745 filed May 4, 2001 by Vijay K. Garg et al., attorney docket number 50039-10010 (200-1095), entitled "Permanent Magnet Degradation Monitoring for Hybrid and Electric Vehicles," the disclosure of which prior application is hereby incorporated by reference, verbatim and with the same effect as through it were fully and completely set forth herein.

Also, this application is related to and shares disclosure with commonly assigned copending U.S. patent application Ser. number 09/682,533 now U.S. Pat. No. 6,427,794 filed Sep. 17, 2001 by Abbas Rafteri et al., attorney docket number 50039-10040 (200-1676), entitled "Adaptive Demagnetization Compensation for a Motor in an Electric or Partially Electric Motor Vehicle," the disclosure of which prior application is hereby incorporated by reference, verbatim and with the same effect as through it were fully and completely set forth herein.

Also, this application is related to and shares disclosure with commonly assigned copending U.S. patent application Ser. No. 09/682,534, now U.S. Pat. No. 6,407,521 filed Sep. 17, 2001 by Abbas Rafteri et al., attorney docket number 50039-10050 (201-0530), entitled "Adaptive Demagnetization Compensation for a Motor in an Electric or partially Electric Motor Vehicle," the disclosure of which prior application is hereby incorporated by reference, verbatim and with the same effect as through it were fully and completely set forth herein.

Also, this application is related to and shares disclosure with commonly assigned copending U.S. patent application Ser. No. 09/682,537, now U.S. Pat. No. 6,591,925 filed Sep. 17, 2001 by Abbas Rafteri et al., attorney docket number 50039-10060, (201-0531), entitled "Adaptive Demagnetization Compensation for a Motor in an Electric or partially Electric Motor Vehicle," the disclosure of which prior application is hereby incorporated by reference, verbatim and with the same effect as through it were fully and completely set forth herein.

BACKGROUND OF INVENTION

The present invention relates generally to hybrid electric vehicles (HEV) and electric vehicles, and specifically to identifying demagnetization of permanent magnets in motors/generators in hybrid electric and electric vehicles.

The need to reduce fossil fuel consumption and emissions in automobiles and other vehicles predominately powered by internal combustion engines (ICEs) is well known. Vehicles powered by electric motors attempt to address these needs. Another alternative known solution is to combine a smaller ICE with electric motors into one vehicle. Such vehicles combine the advantages of an ICE vehicle and an electric vehicle and are typically called hybrid electric vehicles (HEVs). See generally, U.S. Pat. No. 5,343,970 to Severinsky.

The HEV is described in a variety of configurations. In one configuration, the electric motor drives one set of wheels and the ICE drives a different set. Other, more useful, configurations exist. For example, a series hybrid electric vehicle (SHEV) configuration is a vehicle with an engine (most typically an ICE) connected to an electric motor called a generator. The generator, in turn, provides electricity to a battery and another motor, called a traction motor. In the SHEV, the traction motor is the sole source of wheel torque. There is no mechanical connection between the engine and the drive wheels. A parallel hybrid electrical vehicle (PHEV) configuration has an engine (most typically an ICE) and an electric motor that work together in varying degrees to provide the necessary wheel torque to drive the vehicle. Additionally, in the PHEV configuration, the motor can be used as a generator to charge the battery from the power produced by the ICE.

A parallel/series hybrid electric vehicle (PSHEV) has characteristics of both PHEV and SHEV configurations and is sometimes referred to as a "powersplit" configuration. In one of several types of PSHEV configurations, the ICE is mechanically coupled to two electric motors in a planetary gear-set transaxle. A first electric motor, the generator, is connected to a sun gear. The ICE is connected to a carrier. A second electric motor, a traction motor, is connected to a ring (output) gear via additional gearing in a transaxle. Engine torque can power the generator to charge the battery. The generator can also contribute to the necessary wheel (output shaft) torque if the system has a one-way clutch. The traction motor is used to contribute wheel torque and to recover braking energy to charge the battery. In this configuration, the generator can selectively provide a reaction torque that may be used to control engine speed. In fact, the engine, generator motor and traction motor can provide a continuous variable transmission (CVT) effect. Further, the HEV presents an opportunity to better control engine idle speed over conventional vehicles by using the generator to control engine speed.

The generator motor and the traction motor include permanent magnets. These permanent magnets may demagnetize by accident and may degrade or demagnetize over time due to temperature, high current ripples, power ripples, vibration and aging. The demagnetization may degrade vehicle performance such as output power/torque and efficiency. Indeed, the demagnetization may reach a point where safety becomes an issue. More specifically, demagnetization may result in less torque being available to drive the wheels at a critical point, for example, to pass a vehicle. And, demagnetization may result in less energy being available for regenerative braking, which may adversely affect stopping distance/time.

U.S. Pat. No. 5,650,706 issued to Yamada et al. ("Yamada") is directed to a control device for a salient pole type permanent magnet motor. The object of that device is to prevent torque from lowering due to demagnetization of the magnet. A magnetic flux of the permanent magnet is calculated or inferred by determining an electromotive force of the permanent magnet in accordance with a voltage and current supplied to the permanent magnet motor, a rotational speed of the motor, and an inductance of the permanent magnet motor. This electromotive force is compared to a reference electromotive force representative of a fully magnetized permanent magnet. This process is complex and cumbersome. Direct detection of demagnetization is suggested in Yamada by using certain sensors, such as a Hall device or a magnetoresistance element. These direct detection methods suggested in Yamada are relatively expensive and impact serviceability due to location of a complex sensor in the motor housing. Also, demagnetization beyond a safety limit is not monitored and reported for safety-related actions. Furthermore, no specific demagnetized magnets are identified for maintenance.

Therefore, a need exists for an improved method and apparatus for monitoring permanent magnet demagnetization and identifying which magnet(s) within a permanent magnet motor has failed.

SUMMARY OF INVENTION

Accordingly, an object of the present invention is to provide a detection method for determining the specific location of a degraded (demagnetized) permanent magnet for a motor of an electric or a hybrid electric vehicle (HEV).

Another object of the present invention is to provide a safe and direct method for determining the magnetic flux of a permanent magnet in a motor.

Yet another object of the present invention is to determine a state of magnetism of a permanent magnet to adjust a torque of a motor in a vehicle.

Yet another object of the present invention is to provide adaptive strategies to compensate for permanent magnet demagnetization, including protection of components, limited operation, and notification of permanent magnet demagnetization to a user of the vehicle.

Yet still another object of the present invention is to detect and identify demagnetized permanent magnets in a motor in a vehicle.

Other objects of the present invention will become more apparent to persons having ordinary skill in the art to which the present invention pertains from the following description taken in conjunction with the accompanying figures.

In accordance with one aspect of the present invention, a device is provided for detecting permanent magnet demagnetization in a motor in a vehicle. The device includes a voltage monitor that detects a permanent magnet induced voltage within the motor at a predetermined speed and no load condition. The voltage monitor is coupled to a processor that receives the permanent magnet induced voltage, as measured at the predetermined speed, and compares the permanent magnet induced voltage to a reference voltage that reflects the permanent magnet induced voltage for the motor with a fully magnetized permanent magnet. The processor determines a difference in the detected permanent magnet induced voltage and the reference voltage. The difference is analyzed to determine if a permanent magnet is demagnetized. In particular, the permanent magnet induced voltage is a function of the relative positions and locations of the permanent magnets in the motor. This relationship is used to identify a demagnetized magnet. In particular, the permanent magnets are configured such that a change in magnetic reluctance or magnetic strength is used to identify a demagnetized magnet. A diagnostic code is set to alert others of the position of the failing magnet for replacement or other corrective action.

In accordance with another aspect of the present invention, a method is provided for identifying demagnetization of a permanent magnet in a motor of a vehicle. The method includes the step of detecting a first signal that is a function of magnetism of a plurality of permanent magnets in the permanent magnet motor. Then the first signal is compared with a reference signal that represents a function of magnetism of the plurality of magnets in the permanent magnet motor. The reference signal reflects a level of magnetization that is expected where the plurality of permanent magnets in the motor are fully magnetized. A difference between the first signal and the reference signal is analyzed to determine a demagnetized permanent magnet that is likely causing the difference. In particular, the first signal and reference signal include points of synchronization that relate to the position of potentially demagnetized permanent magnets. More specifically, the points of synchronization are caused by a predetermined change in structure of the motor at a particular location relative to the location of the permanent magnets. This change in structure results in a change in motor reluctance or magnet strength that is reflected in the first signal and the reference signal. Hence, differences between the first signal and the reference signal are correlated to a position of a demagnetized permanent magnet. A device in accordance with the invention includes a processor that executes the method described above.

BRIEF DESCRIPTION OF DRAWINGS

The foregoing objects, advantages, and features, as well as other objects and advantages, will become apparent with reference to the description and figures below, in which like numerals represent like elements and in which.

DETAILED DESCRIPTION

Figure 5:
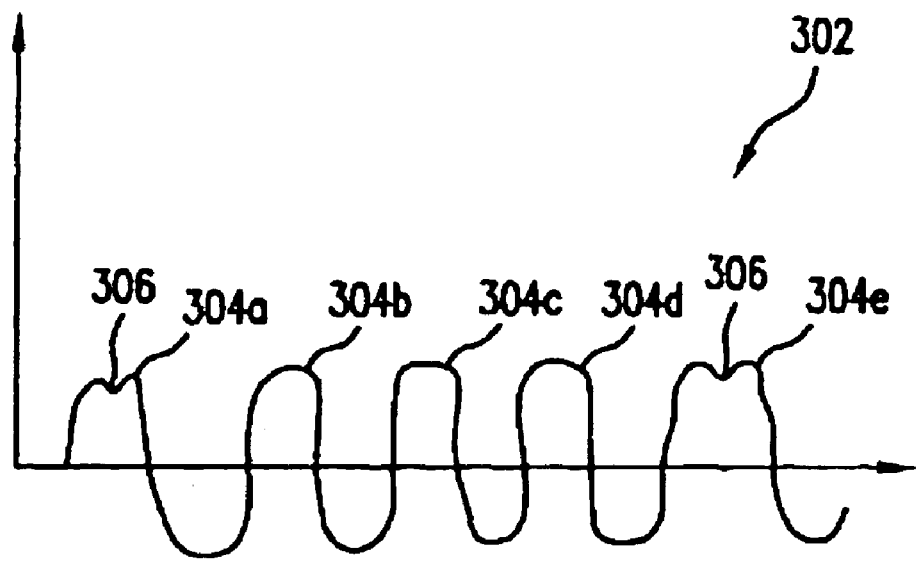
FIG. 5 and FIG. 6 are graphs illustrating a method for detecting a fault due to permanent magnetism degradation in accordance with a preferred embodiment of the present invention.
Figure 6:
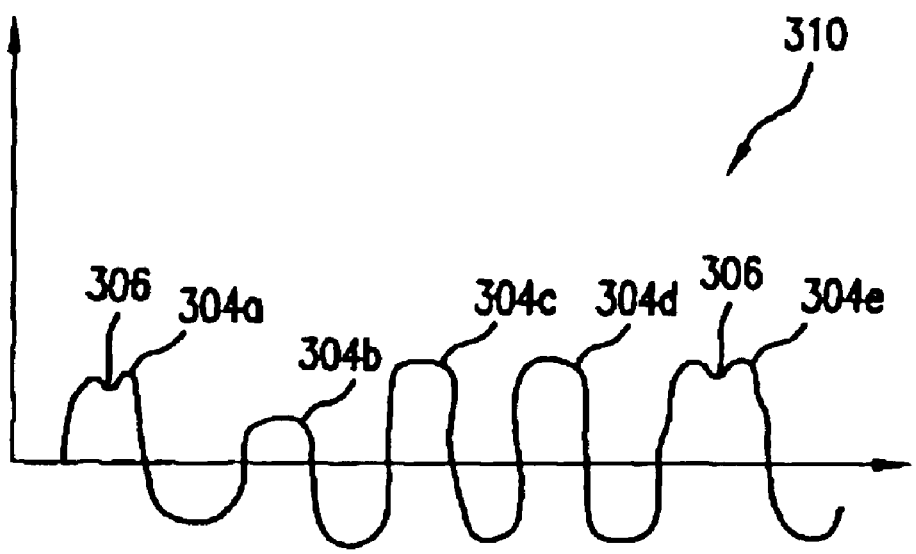

FIG. 5 and FIG. 6 are graphs illustrating a method for detecting a demagnetization of a permanent magnet in accordance with a preferred embodiment of the present invention.

Figure 1:
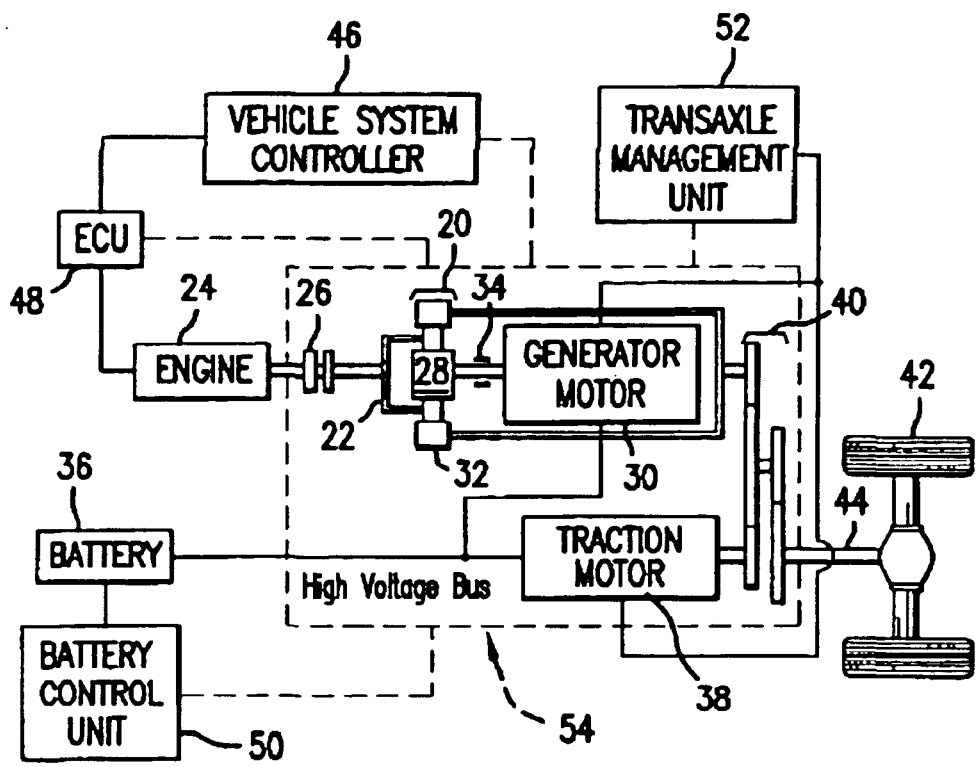
FIG. 1 is a block diagram illustrating a hybrid electric vehicle (HEV) configuration in accordance with a preferred embodiment of the present invention.

In the HEV of FIG. 1, a planetary gear set 20 mechanically couples a carrier gear 22 to an engine 24 via a one way clutch 26. The planetary gear set 20 also mechanically couples a sun gear 28 to a generator motor 30 and a ring (output) gear 32. The generator motor 30 also mechanically links to a generator brake 34 and is electrically linked to a battery 36. A traction motor 38 is mechanically coupled to the ring gear 32 of the planetary gear set 20 via a second gear set 40 and is electrically linked to the battery 36. The ring gear 32 of the planetary gear set 20 and the traction motor 38 are mechanically coupled to drive wheels 42 via an output shaft 44.

The planetary gear set 20 splits the engine output energy into a series path from the engine 24 to the generator motor 30 and a parallel path from the engine 24 to the drive wheels 42. Engine speed can be controlled by varying the split to the series path while maintaining the mechanical connection through the parallel path. The traction motor 38 augments the engine power to the drive wheels 42 on the parallel path through the second gear set 40. The traction motor 38 also provides the opportunity to use energy directly from the series path, essentially running off power created by the generator motor 30. This reduces losses associated with converting energy into and out of chemical energy in the battery 36 and allows all engine energy, minus conversion losses, to reach the drive wheels 42.

A vehicle system controller (VSC) 46 controls many components in this HEV configuration by connecting to each component's controller. An engine control unit (ECU) 48 connects to the engine 24 via a hardwire interface. The ECU 48 and VSC 46 can be housed in the same unit, but are preferably separate controllers. The VSC 46 communicates with the ECU 48, as well as a battery control unit (BCU) 50 and a transaxle management unit (TMU) 52 through a communication network, such as a controller area network (CAN) 54. The BCU 50 connects to the battery 36 via a hardwire interface. The TMU 52 controls the generator motor 30 and traction motor 38 via a hardwire interface. More specifically, TMU 52 includes a controller that executes a stored program to determine the torque of generator motor 30 and traction motor 38. Also, in accordance with the present invention, TMU 52 detects and stores an indication of the magnetization of permanent magnets in generator motor 30 and traction motor 38. In particular, a voltage sensor incorporated in generator motor 30 and a voltage sensor in traction motor 38 determine a voltage that is proportional to the magnetization of permanent magnets in generator motor 30 and traction motor 38, as described below. Also, in accordance with the present invention, TMU 52 determines which permanent magnets are likely demagnetized due to changes in magnetization.

Figure 2:
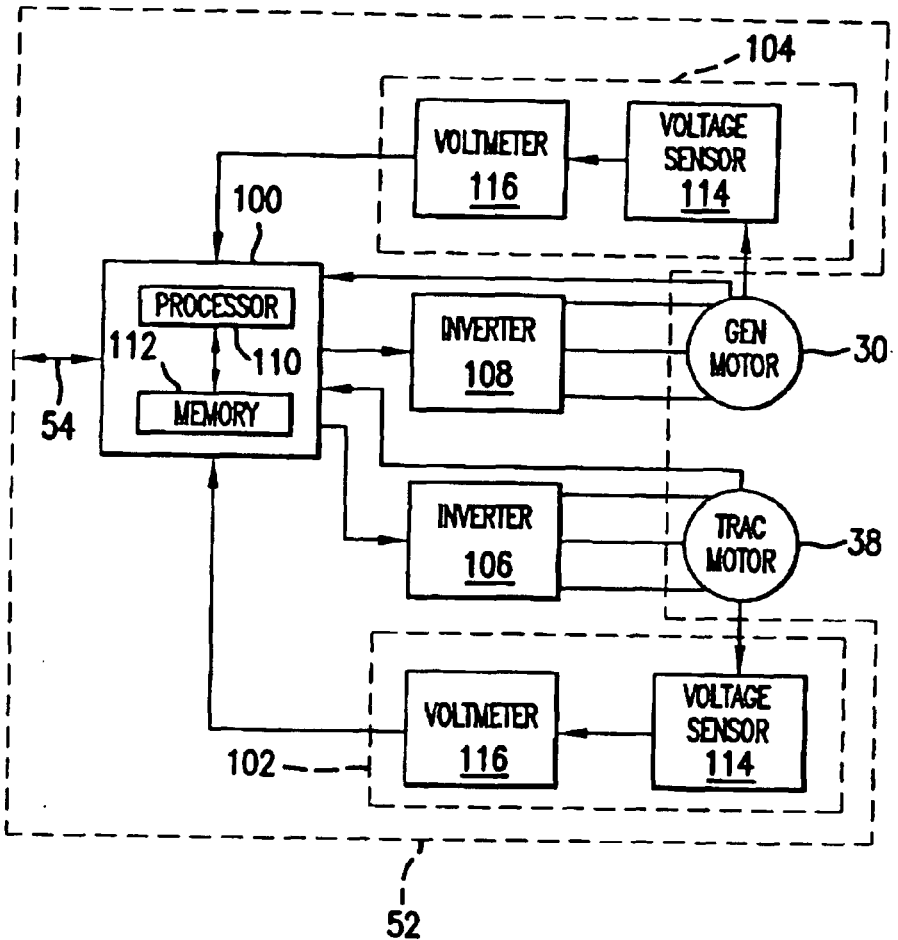
FIG. 2 is a block diagram of a transaxle management unit in accordance with a preferred embodiment of the present invention.

FIG. 2 is a block diagram of a portion of transaxle management unit 52 shown interfaced to generator motor 30 and traction motor 38 in accordance with a preferred embodiment of the present invention. TMU 52 preferably includes a controller 100, a voltage monitor 102, a voltage monitor 104, an inverter 106 and an inverter 108. Inverter 106 is coupled to traction motor 38 to provide a three-phase AC current to traction motor 38. The three-phase AC current is derived from a DC current from battery 36. Similarly, inverter 108 is coupled to generator motor 30 to provide a three-phase AC current to generator motor 30. The three-phase AC current is also derived from a DC current from battery 36. Inverter 106 an inverter 108 are coupled to controller 100 such that controller 100 provides input signals to inverters 106,108 to determine a current provided to generator motor 30 and traction motor 38, respectively. In accordance with the present invention, a voltage monitor 102 is coupled to traction motor 38 to determine a permanent magnet induced voltage of traction motor 38. Similarly, a voltage monitor 104 is coupled to generator motor 30 to determine a permanent magnet induced voltage in generator motor 30. The permanent magnet induced voltages from traction motor 38 and generator motor 30 are used by controller 100 to determine a state of the permanent magnets contained within traction motor 38 and generator motor 30. Based on the state of the permanent magnets in traction motor 38 and generator motor 30, controller 100 determines a current provided by inverters 106, 108; determines whether the traction motor 38 or generator motor 30 are operable; and initiates warnings to a user. Also, a signal corresponding to the state of the permanent magnets in traction motor 38 and generator motor 30 is analyzed to determine and identify likely component failures.

Controller 100 preferably includes a processor 110 and a memory 112. Processor 110 comprises one or more microprocessors, micro-controllers, or the like. Controller 100 preferably executes a stored program to determine, store, analyze and transmit an indication of the state of magnetism of the permanent magnets contained within generator motor 30 and traction motor 38. Also, controller 100 preferably executes a stored program to determine actions to be taken based on the state of magnetism of the permanent magnets contained within generator motor 30 and traction motor 38. Most preferably, memory 112 includes a non-volatile memory component that stores an indication of the state of magnetism of the permanent magnets in generator motor 30 and traction motor 38.

Voltage monitors 102,104 preferably include a voltage sensor 114 and a voltmeter 116. Voltage sensor 114 is directly coupled to its respective motor to determine a permanent magnet induced voltage at a predetermined speed of the motor 38. The voltmeter 116 provides the voltage from voltage sensor 114 to controller 100 for use in determining the state of magnetism of the permanent magnets in generator motor 30 and traction motor 38. Preferably, the voltmeter is housed external to the motor. Most preferably, the voltmeter is hardware available on the vehicle that is reused for the magnetization monitoring function, which function is only required periodically.

Figure 3:
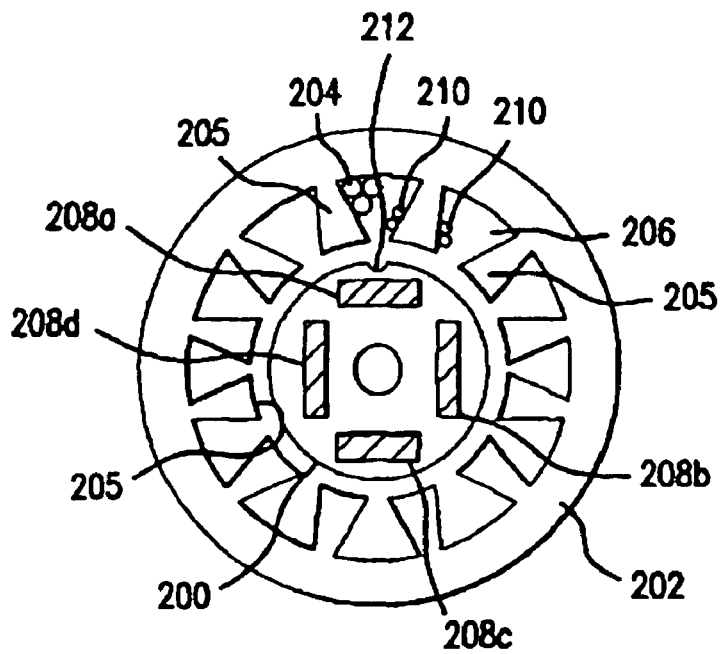
FIG. 3 is a cross sectional view of a motor in accordance with a preferred embodiment of the present invention.

FIG. 3 is a sectional view of generator motor 30 including a preferred voltage sensor in accordance with the present invention. A similar arrangement is preferred for traction motor 38. Generator motor 30 includes a rotor 200 and a stator 202. Permanent magnets 208a–d are mounted within rotor 200. The motor windings 204 (as exemplary shown between two stator teeth) are wrapped around the teeth 205 in slots 206 in stator 202 in the traditional manner. In accordance with the invention, a sensor coil 210 is wrapped around the teeth 205 in slots 206 in stator 202. As shown in FIG. 3, sensor coil 210 is preferably located adjacent rotor 200 at an edge of the teeth 205 closest to a gap between stator 202 and rotor 200. Preferably, sensor coil 210 comprises a wire having a very high gauge and a few turns. The sensor coil 210 is coupled to voltmeter 116 and serves as a voltage sensor 114. Sensor coil 210 is used to determine a permanent magnet induced voltage in generator 30. More specifically, when no current is running through motor windings 204, a voltage is induced in sensor coil 210 due to the rotation of rotor 200 and a magnetic field generated by permanent magnets 208. This voltage is sensed by voltmeter 116 and is transmitted to controller 100.

In accordance with an aspect of the present invention, rotor 200 includes an indication, irregularity or notch 212 positioned in an area of the rotor iron near and adjacent to permanent magnets 208a. As discussed further below, notch 212 is used to generate a signal that has a point of synchronization that relates to the position/location of a particular one or more of permanent magnets 208a–d, in this case, magnet 208a. More specifically, notch 212 changes the motor reluctance or magnetic resistance, which results in a corresponding change in a voltage induced in sensor coil 210. Based on the point of synchronization, a failing or demagnetized permanent magnet is identified.

Figure 4:
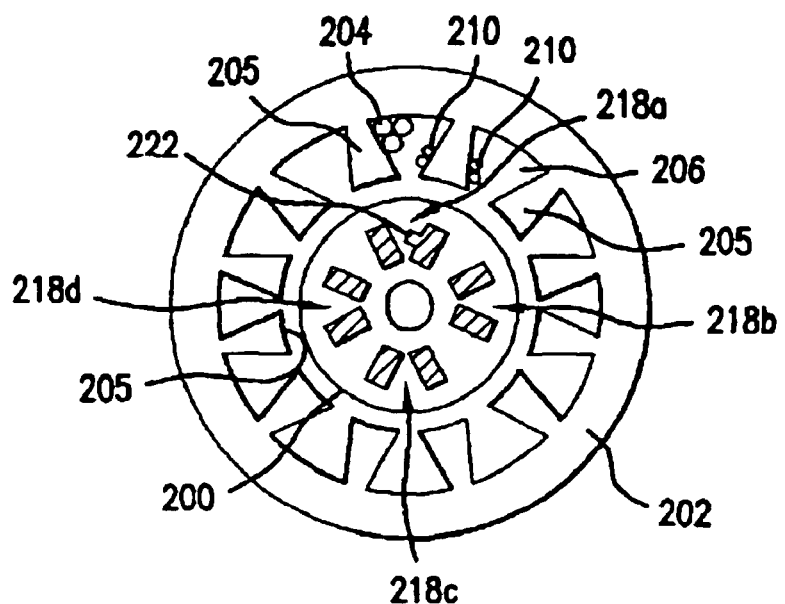
FIG. 4 is a cross sectional view of a motor in accordance with an alternate preferred embodiment of the present invention.

FIG. 4 is a cross-sectional view of a motor that is similar to the motor shown in FIG. 3. The similar parts are marked with similar reference numerals. The primary difference between the motor of FIG. 4 and the motor of FIG. 3 is the arrangement of permanent magnets. In particular, groups of magnet arrays are positioned about rotor 200. More specifically, permanent magnet sets (each set consisting of a pair of magnets) 218a, 218b, 218c, and 218d are shown at approximately zero degrees, 90 degrees, 180 degrees, and −90 degrees around rotor 200.

In accordance with an aspect of the present invention, permanent magnet set 218a includes a predetermined irregularity, protrusion 222, on one the permanent magnets in permanent magnet set 218a. Protrusion 222 is preferably an extension of a magnet of permanent magnet set 218a or an additional component of magnetic material. As discussed further below, protrusion 222 is used to change the magnetic strength of the magnet set 218a (as compared to 218b–d), which in turn generates a signal that has a point of synchronization that relates to the position of permanent magnet set 218a. Based on the point of synchronization, a demagnatized permanent magnet or set is identified. As an alternative to using additional magnetic material for protrusion 222, protrusion 222 may be non-magnetic material, such as brass. In this case, the protrusion causes an increase in motor rotor reluctance at the protrusion, which in turn generates a signal that has a point of synchronization that relates to the position of permanent magnet set 218a.

In operation, the permanent magnet induced voltage of the motor is determined. In the preferred embodiment, this is accomplished by inducing a voltage in sensor coil 210 during a period of time when no current is flowing in the motor windings; i.e., there is no load. Preferably, voltmeter 116 quantifies the voltage induced in the sensor coil 210. The no load condition occurs when there is zero current in the stator windings of the motor. For example, the no load condition occurs when the vehicle is at idle, for example, stopped at a stop light, and also, when the vehicle is at cruising speed and there is no current in the motor windings. Another exemplary no load condition occurs when the generator motor is not supplying any torque to the wheels or receiving torque from the engine to charge the batteries. The permanent magnet induced voltage is preferably induced by the rotation of rotor 200, including permanent magnets 208a–d. This causes a magnetic field that induces the voltage in the sensor coil. Most preferably, rotor 200 is rotated at a predetermined speed and the inverter contacts that supply current to the motor are opened during permanent magnet induced voltage measurement. The TMU 52, and more specifically, controller 100 determines when to measure the permanent magnet induced voltage in light of the state of the vehicle, which state is preferably obtained via controller area network 54 or any other suitable means.

The permanent magnet induced voltage is proportional to the magnetic field (flux) and the speed of rotation of the rotor. Hence, the strength of the permanent magnet is readily obtained where the speed and permanent magnet induced voltage are known.

After the permanent magnet induced voltage is detected, the permanent magnet induced voltage is compared to a reference voltage that reflects a permanent magnet induced voltage at no demagnetization and the same predetermined speed at which the permanent magnet induced voltage is detected. That is, the reference voltage is the value expected for the permanent magnet induced voltage if the permanent magnet is fully magnetized. Preferably, the reference voltage is stored in TMU 52. Any difference between the reference voltage and the detected permanent magnet induced voltage is used to determine an indication of the amount of demagnetization of the permanent magnet. This indication is preferably stored in a non-volatile memory for further reference. Also, the indication of magnetic strength is compared to a first threshold to determine if the permanent magnet has reached a point of demagnetization where additional precautions should be taken. Most preferably, if the magnetic strength is below a predetermined first threshold, an indication is made to a user of the vehicle, for example, through an audible or visual indication that is transmitted via controller area network 54. Also, the current to the motor is limited to an amount that prevents damage to components of the vehicle and/or the TMU 52 is calibrated to more accurately drive the inverter to force the motor to provide the torque required. Most preferably, the first threshold is chosen such that at least limited operation of the vehicle is possible. During a period of continued limited operation, permanent magnet demagnetization along with other motor parameters, such as temperature, are monitored. The results from further monitoring are compared to a second threshold. This threshold is alternatively a level of magnetism, a certain temperature, or another monitored parameter. If the second threshold is not met, then monitoring continues. If the second threshold is met, then subsequent motor operation is suspended and a user of the vehicle is warned with an audible or visual indicator. Where another source of motive power is available, operation of the wheels of the vehicle is switched to that motive source. For example, in the preferred embodiment of FIG. 1, if the generator motor 30 is made inoperable due to permanent magnet demagnetization, then wheels 42 are operated under control of traction motor 38. Alternatively, if traction motor 38 is made inoperable due to permanent magnet demagnetization, then wheels 42 are operated under control of motor 30 and engine 24. Most preferably, if the traction motor 38 is inoperable, generator motor 30 is first used to bring wheels 42 to a certain speed, and then engine 24 is activated to provide additional motive force via a smooth transition.

Once maintenance of the vehicle occurs, a demagnetized permanent magnet or magnet set, is identified for replacement. In particular, a point of synchronization in a function of permanent magnet strength is compared to a reference function of permanent magnet strength. Differences between a detected function and the reference function are used to locate a demagnetized magnet in a manner described below with respect to FIG. 5 and FIG. 6.

FIG. 5 is a graph illustrating a reference function of permanent magnet strength in accordance with the present invention. More specifically, FIG. 5 shows a curve 302 that represents a voltage plotted over time. Curve 302 represents a voltage detected in accordance with the present invention when a motor has fully magnetized permanent magnets. Though voltage is preferred, another quantity that is a function of permanent magnetization, such as current, power or magnetic flux, is alternatively used. Curve 302 has points of synchronization 306. For the reference voltage shown as curve 302, points of synchronization 306 occur periodically.

Curve 302 has peaks labeled as peak 304a, peak 304b, peak 304c, peak 304d and peak 304e. These peaks represent a high voltage induced in coils 210 due to a permanent magnet in rotor 200 passing in close proximity to coils 210. With reference to FIG. 3, peak 304a represents magnet 208a and notch 212 rotating near search coils 210. Similarly, peak 304b represents magnet 208b passing the search coils 210. Peaks 304c and 304d represent respectively, magnets 208c and 208d passing search coils 210 in the course of rotation of rotor 200. Peak 304e represents another passing of magnet 208a and notch 212. Notably, notch 212 corresponds to and generates the points of synchronization 306 shown FIG. 5. More specifically, notch 212 causes a change in motor reluctance or magnetic resistance, which change results in a dimple, notch or depression at points of synchronization 306. In alternative embodiments, for example, for the motor arrangement shown in FIG. 4, where a change in magnetic strength is caused by the addition of magnetic material, the point of synchronization is characterized by a protrusion or bump caused by the additional magnetic material.

FIG. 6 shows a curve 310 of an exemplary detected function of magnet demagnetization in accordance with an aspect of the present invention. Curve 310 illustrates a voltage detected as a result of magnet demagnetization of one of permanent magnets 208a–d of FIG. 3. An analysis of curve 310 is preferably used to determine which permanent magnet is contributing to demagnetization so that that magnet may be replaced. Notably, curve 310 has points of synchronization 306. The points of synchronization are used to delineate a signal for comparison with a reference signal. Deviations between the comparison are indicative of a demagnetized permanent magnet component. Notably, peak 304b is substantially degraded in curve 310. Since peak 304b relates to magnet 208b, curve 310 indicates demagnetization of magnet 208b. A comparison of curve 310 and curve 302 readily identifies the demagnetization in curve 310, which reflects that curve 310 indicates magnet 208b is demagnetized. preferably, a diagnostic code in the vehicle is set to indicate that magnet 208b is demagnetized.

As an alternative to notch 212 and protrusion 222, other irregularities may be put in the permanent magnet motor to provide points of synchronization in detected waveforms. In general, introduction of a non-magnetic material to increase the motor reluctance, such as a gap (e.g., air gap), notch or dimple, causes a dimple or depression in a corresponding waveform. And, introduction of additional magnetic material, such as a protrusion of magnetic material, generally causes an increase in magnetic flux, which causes a corresponding bump, peak or protrusion in a corresponding waveform. The change in motor reluctance or magnetic strength is alternatively implemented in the rotor and/or the stator of the motor. One preferred alternative to notch 212 or protrusion 222 is placing a relatively small magnet between a permanent magnet or magnet set, such that the small magnet causes a small synchronizing peak in a corresponding waveform detected by a voltage monitor.

As discussed above, the present invention provides a simple and effective method of determining the state of magnetism of a permanent magnet in a motor of a vehicle. Advantageously, a signal representative of the state of magnetism is compared with a previously stored signal representative of the fully magnetized state to identify likely demagnetized permanent magnets.

The above-described embodiments of the invention are provided purely for purposes of example. Many other variations, modifications, and applications of the invention may be made.

What is claimed is:

1. A device for detecting permanent magnet demagnetization in a motor in a vehicle comprising:
   a permanent magnet induced voltage monitor that measures a detected permanent magnet induced voltage of the motor at a predetermined speed, wherein the permanent magnet induced voltage monitor has
      a sensor coil wrapped around a plurality of teeth in a plurality of slots of a stator of the motor adjacent to a rotor of the motor at an edge closest to a gap between the stator and the rotor of the motor, and wherein the sensor coil is not related to a plurality of windings of the motor, and
      a voltmeter disposed in the vehicle coupled to the sensor coil of the motor, wherein the voltmeter periodically monitors of the state of magnetism of the permanent magnets in the motor during no load conditions to provide the detected permanent magnet induced voltage to a processor;
   a predetermined irregularity in the motor that cooperates with the sensor coil to locate a position of each of a plurality of permanent magnets in the motor; and a processor that:
      compares the detected permanent magnet induced voltage with a reference voltage that reflects a permanent magnet induced voltage of the motor with a fully magnetized permanent magnet at the predetermined speed; and
      analyzes the detected permanent magnet induced voltage with reference to the reference voltage to determine whether a characteristic of the detected permanent magnet induced voltage indicates a demagnetized permanent magnet of the motor.

2. The device of claim 1 wherein the processor analyzes the detected permanent magnet induced voltage with reference to a point of synchronization that relates to a position of a permanent magnet in the motor.

3. The device of claim 2 wherein the point of synchronization is caused by the predetermined irregularity in the motor.

4. The device of claim 3 wherein the predetermined irregularity is formed in one of a rotor and a permanent magnet.

5. The device of claim 2 wherein the point of synchronization is caused by a predetermined change in one of motor reluctance and magnetic strength.

6. The device of claim 1 wherein current to the motor is limited to an amount that prevents damage to components of the vehicle when the magnetic strength of the motor is below a predetermined first threshold.

7. The device of claim 6 wherein the processor is calibrated to force the motor to provide the torque required when the current to the motor is limited.

8. The device of claim 7 wherein operation of the motor is suspended and the motive power within the vehicle is switched to an available second motor providing an alternative motive source when a second threshold of magnetization is met.

9. A method for identifying a component that is causing permanent magnet demagnetization in a motor of a vehicle, the method comprising the steps of:
   providing a sensor coil wrapped around a plurality of teeth in a plurality of slots of a stator of the motor adjacent to a rotor of the motor at an edge closest to a gap between the stator and the rotor of the motor, wherein the sensor coil is not related to a plurality of windings of the motor;
   using the sensor coil to sense permanent magnet induced voltage in the motor;
   providing a voltmeter disposed in the vehicle coupled to the sensor coil of the motor;
   using the voltmeter to periodically monitor the state of magnetism sensed by the sensor coil of each of the plurality of permanent magnets in the motor during no load conditions;
   providing a predetermined irregularity in the motor that cooperates with the sensor coil to locate a position of each of a plurality of permanent magnets in the motor;
   detecting a first signal from the voltmeter that is a function of permanent magnetization of a plurality of permanent magnets in the motor;
   comparing the first signal with a reference signal that represents a function of permanent magnetization of the plurality of magnets in the motor, wherein the reference signal reflects a level of magnetization that is expected where the plurality of permanent magnets in the motor are fully magnetized; and
   analyzing a difference between the first signal and the reference signal to determine a demagnetized permanent magnet selected from the plurality of permanent magnets that is likely causing the difference.

10. The method of claim 9 further comprising the step of:
setting a diagnostic code indicating the demagnetized permanent magnet selected from the plurality of permanent magnets.

11. The method of claim 9 wherein the first signal is a permanent magnet induced voltage and the reference signal is a permanent magnet induced voltage.

12. The method of claim, 11 wherein the first signal is detected by inducing a voltage in the sensor coil .

13. The method of claim 9 wherein the first signal includes a point of synchronization and the reference signal includes a point of synchronization.

14. The method of claim 13 wherein the point of synchronization of the first signal is determined by the predetermined irregularity in the motor.

15. The method of claim 14 wherein the predetermined irregularity causes a change in one of motor reluctance and magnetic strength.

16. A device for identifying a permanent magnet that is demagnetized in a motor of vehicle, the device comprising:
  a sensor coil wrapped around a plurality of teeth in a plurality of slots of a stator of the motor adjacent to a rotor of the motor at an edge closest to a gap between the stator and the rotor of the motor that operates to sense permanent magnet induced voltage in the motor, and wherein the sensor coil is not related to a plurality of windings of the motor;
  a voltmeter disposed in the vehicle coupled to the sensor coil of the motor, wherein the voltmeter periodically monitors of the state of magnetism of the permanent magnets in the motor during no load conditions to provide the detected permanent magnet induced voltage to a processor;
  a predetermined irregularity in the motor that cooperates with both the sensor coil and the processor to locate a position of each of the plurality of permanent magnets in the motor; and
  a processor that:
    receives a first signal that is a function of permanent magnetization of a plurality of permanent magnets in the motor;
    compares the first signal with a reference signal that represents a function of permanent magnetization of the plurality of magnets in the motor, wherein the reference signal reflects a level of magnetization that is expected where the plurality of permanent magnets in the motor are fully magnetized;
    analyzes a difference between the first signal and the reference signal to determine a demagnetized permanent magnet selected from the plurality of permanent magnets in the motor that is likely causing the difference.

17. The device of claim 16 further comprising the processor setting a diagnostic code indicating the demagnetized permanent magnet.

18. The device of claim 16 wherein the first signal is a permanent magnet induced voltage and the reference signal is a permanent magnet induced voltage.

19. The device of claim 18 wherein the first signal is detected by inducing a voltage in the sensor coil.

20. The device of claim 16 wherein the first signal includes a point of synchronization and the reference signal includes a point of synchronization.

21. The device of claim 20 wherein the point of synchronization of the first signal is determined by the predetermined irregularity in the motor.

22. The device of claim 21 wherein the predetermined irregularity is formed in one of a rotor and a permanent magnet of the plurality of permanent magnets.

* * * * *